(12) United States Patent
Choi et al.

(10) Patent No.: US 8,937,312 B2
(45) Date of Patent: Jan. 20, 2015

(54) ORGANIC LIGHT-EMITTING DISPLAY APPARATUS

(75) Inventors: Jong-Hyun Choi, Yongin (KR); Byoung-Ki Kim, Yongin (KR); Sol-Ji Kim, Yongin (KR); Dae-Woo Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 19 days.

(21) Appl. No.: 13/489,650

(22) Filed: Jun. 6, 2012

(65) Prior Publication Data
US 2013/0146877 A1     Jun. 13, 2013

(30) Foreign Application Priority Data

Dec. 9, 2011   (KR) .................. 10-2011-0132126

(51) Int. Cl.
*H01L 29/10*     (2006.01)

(52) U.S. Cl.
USPC .......................................................... 257/59

(58) Field of Classification Search
CPC ............ H01L 51/5271; H01L 51/5237; H01L 51/5265
USPC .................. 257/40, 59, 71, 88, 296, E21.002, 257/E21.008, E21.415, E21.411, E27.016, 257/E27.112, E33.053, E33.072, E33.003; 438/29, 42, 155, 23
See application file for complete search history.

(56) References Cited

U.S. PATENT DOCUMENTS

| 7,468,581 | | 12/2008 | Maeda et al. |
| 7,573,191 | B2 * | 8/2009 | Kobayashi .................... 313/503 |
| 7,671,376 | B2 * | 3/2010 | Miyata et al. ................... 257/98 |
| 2004/0113875 | A1 * | 6/2004 | Miller et al. .................... 345/82 |
| 2004/0263072 | A1 * | 12/2004 | Park et al. ...................... 313/509 |
| 2007/0205717 | A1 * | 9/2007 | Yasukawa ...................... 313/506 |
| 2010/0193790 | A1 * | 8/2010 | Yeo et al. ........................ 257/59 |
| 2010/0270538 | A1 * | 10/2010 | Kang .............................. 257/40 |

FOREIGN PATENT DOCUMENTS

| JP | 2006-302748 | 11/2006 |
| KR | 10-0721052 | 5/2007 |
| KR | 10-2009-0120698 A | 11/2009 |

* cited by examiner

*Primary Examiner* — Yu-Hsi D Sun
*Assistant Examiner* — Christina Sylvia
(74) *Attorney, Agent, or Firm* — Lee & Morse, P.C.

(57) ABSTRACT

An organic light-emitting display apparatus including: a substrate; a first electrode on the substrate; a second electrode on the first electrode; an intermediate layer between the first electrode and the second electrode, the intermediate layer being electrically connected with the first electrode and the second electrode, and including an organic emission layer; and a light reflection member overlapping a portion of the intermediate layer, the portion of the intermediate layer being less than an entire region of the intermediate layer.

26 Claims, 4 Drawing Sheets

ORGANIC LIGHT-EMITTING DISPLAY APPARATUS

CROSS-REFERENCE TO RELATED PATENT APPLICATION

Korean Patent Application No. 10-2011-0132126, filed on Dec. 9, 2011, in the Korean Intellectual Property Office, is incorporated herein in its entirety by reference.

BACKGROUND

1. Field

The embodiments relate to an organic light-emitting display apparatus.

2. Description of the Related Art

Portable, thin, flat panel display devices are increasingly in demand. Among the flat panel display devices, organic light-emitting display apparatuses are self-emissive display devices having a wide viewing angle, an excellent contrast ratio, and a high response speed. As such, organic light-emitting display apparatuses are regarded as next-generation display devices.

The organic light-emitting display apparatus may include an intermediate layer, a first electrode, and a second electrode. The intermediate layer may include an organic emission layer. When a voltage is applied to the first and second electrodes, a visible ray may be generated in the organic emission layer.

SUMMARY

One or more embodiments may provide an organic light-emitting display apparatus including: a substrate; a first electrode on the substrate; a second electrode on the first electrode; an intermediate layer between the first electrode and the second electrode, the intermediate layer being electrically connected with the first electrode and the second electrode, and including an organic emission layer; and a light reflection member overlapping a portion of the intermediate layer, the portion of the intermediate layer being less than an entire region of the intermediate layer. The light reflection member may reflect a portion of a visible ray and transmits another portion of the visible ray. A size of the light reflection member is less than a size of the intermediate layer. A size of the light reflection member may be less than a size of the first electrode.

A first insulating layer may be between the substrate and the light reflection member. A buffer layer may be between the substrate and the first insulating layer. A second insulating layer may be between the light reflection member and the first electrode. The second insulating layer may overlap a region of the first electrode that does not overlap the light reflection member. A third insulating layer may be between the second insulating layer and the first electrode.

The light reflection member may include silver (Ag) or aluminum (Al). The first electrode may include indium tin oxide (ITO), indium zinc oxide (IZO), zinc oxide (ZnO), indium oxide (In2O3), indium gallium oxide (IGO), or aluminum zinc oxide (AZO).

The organic light-emitting display apparatus may include a plurality of sub-pixels, the first electrode, the intermediate layer, and the second electrode may correspond in position with each of the plurality of sub-pixels, and the light reflection member corresponds in position with at least one sub-pixel from among the plurality of sub-pixels. At least some of the plurality of sub-pixels are for emitting visible rays having different colors, and the light reflection member may correspond in position with at least one sub-pixel from among the plurality of sub-pixels, wherein the at least one sub-pixel emits a visible ray having one of the different colors. The light reflection member may correspond in position with a sub-pixel from among the plurality of sub-pixels that emits a blue visible ray.

The organic light-emitting display apparatus may further include a thin film transistor (TFT) on the substrate, the thin film transistor (TFT) being electrically connected to the first electrode, and comprising an active layer, a gate electrode, a source electrode, and a drain electrode. The light reflection member and the active layer may be on different layers, and the light reflection member may be closer to the substrate than the active layer. The first electrode may be on a same layer as the gate electrode and may include at least a portion of a material that forms the gate electrode.

The gate electrode may include a first conductive layer and a second conductive layer on the first conductive layer, the gate electrode including a same material as the first conductive layer and being on a same layer as the first conductive layer. The intermediate layer may not overlap the TFT and may be spaced from the TFT.

The organic light-emitting display apparatus may further include a capacitor having a first capacitor electrode and a second capacitor electrode, wherein the first capacitor electrode is on a same layer as the active layer, and the second capacitor electrode is on a same layer as the gate electrode.

BRIEF DESCRIPTION OF THE DRAWINGS

The above and other features and advantages of the embodiments will become more apparent by describing in detail exemplary embodiments thereof with reference to the attached drawings in which.

DETAILED DESCRIPTION

Hereinafter, the embodiments will be described in detail by explaining exemplary embodiments with reference to the attached drawings.

Figure 1:
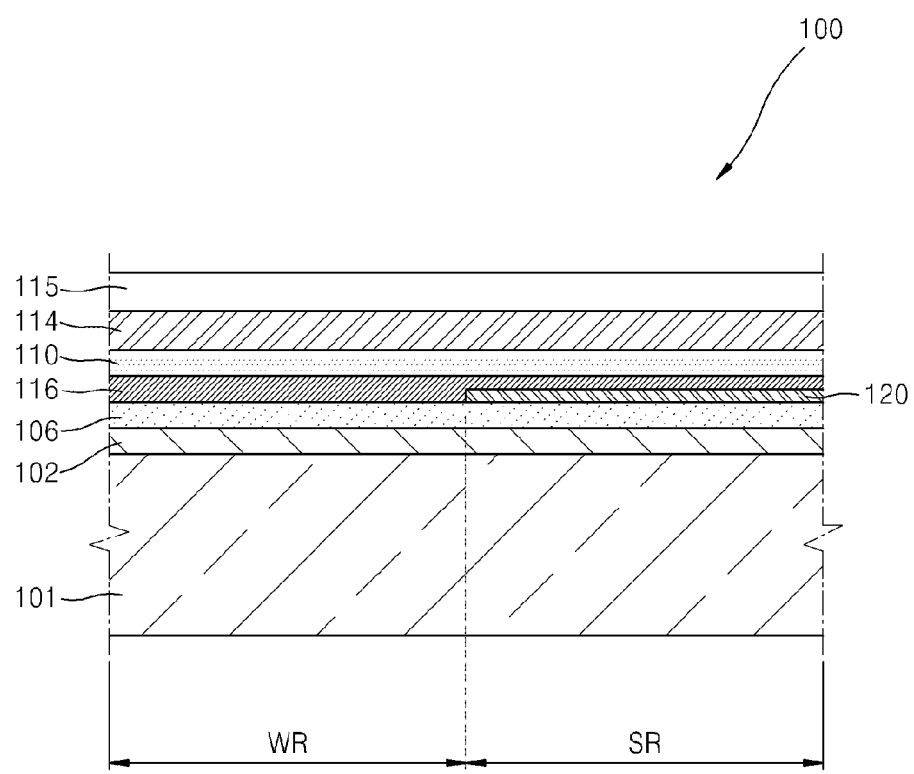
FIG. 1 illustrates a cross-sectional view of an organic light-emitting display apparatus according to an embodiment.

FIG. 1 illustrates a cross-sectional view of an organic light-emitting display apparatus 100 according to an embodiment.

Referring to FIG. 1, the organic light-emitting display apparatus 100 may include a substrate 101, a first electrode 110, a light reflection member 120, an intermediate layer 114, and a second electrode 115.

Hereinafter, a configuration of each element will be described in detail.

The substrate 101 may include transparent glass including $SiO_2$ as a main component, but is not limited thereto. The substrate 101 may include a transparent plastic material. The transparent plastic material may be selected from various organic materials.

A buffer layer 102 is formed on the substrate 101. The buffer layer 102 prevents moisture and foreign substances from approaching the substrate 101, and provides a flat surface on the substrate 101. The buffer layer 102 may include one of various materials capable of performing the aforementioned functions. For example, the buffer layer 102 may include inorganic materials, such as silicon oxide, silicon nitride, silicon oxynitride, aluminum oxide, aluminum nitride, titanium oxide, titanium nitride, or the like. The buffer layer 102 may include organic materials, such as polyimide, polyester, acryl, or the like. The buffer layer 102 may be a composite layer formed of a plurality of materials selected from the aforementioned materials. Also, the buffer layer 102 is not an essential element and thus may not be included in the organic light-emitting display apparatus 100.

A first insulating layer 106 is formed on the buffer layer 102. The first insulating layer 106 includes silicon oxide or silicon nitride. The light reflection member 120, having a predetermined size, is formed on the first insulating layer 106. The light reflection member 120 reflects a portion of a visible ray and transmits another portion of the visible ray. The light reflection member 120 may be formed as a thin film including aluminum (Al) or silver (Ag).

The light reflection member 120 overlaps only a portion of the intermediate layer 114, and not an entire region of the intermediate layer 114. As such, a size of the light reflection member 120 may be less than a size of the first electrode 110.

A second insulating layer 116 is formed on the light reflection member 120. The second insulating layer 116 is formed on the first insulating layer 106. The second insulating layer 116 covers the light reflection member 120. The second insulating layer 116 may be formed of various insulating materials. For example, the second insulating layer 116 is formed of an insulating layer including silicon oxide or silicon nitride.

The first electrode 110 is formed on the second insulating layer 116. The first electrode 110 is formed of a transmission-type conductive material. In more detail, the first electrode 110 may be formed of indium tin oxide (ITO), indium zinc oxide (IZO), zinc oxide (ZnO), indium oxide ($In_2O_3$), indium gallium oxide (IGO), or aluminum zinc oxide (AZO).

The intermediate layer 114 is formed on the first electrode 110. The intermediate layer 114 includes an organic emission layer that may emit a visible ray.

The intermediate layer 114 may be formed as a small-molecule organic layer or a polymer organic layer. When the intermediate layer 114 is formed as the small-molecule organic layer, the intermediate layer 114 may include a hole injection layer (HIL), a hole transport layer (HTL), the organic emission layer, an electron transport layer (ETL), an electron injection layer (EIL), and the like.

The HIL may be formed of a phthalocyanine compound, including copper phthalocyanine, or TCTA, m-MTDATA, m-MTDAPB, or the like, which is a starburst-type amine.

The HTL may be formed of N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or the like.

The EIL may be formed of lithium fluoride (LiF), sodium chloride (NaCl), caesium fluoride (CsF), lithium oxide ($Li_2O$), barium oxide (BaO), or Liq.

The ETL may be formed of aluminum tris(8-hydroxyquinoline) (Alq3).

The organic emission layer may include a host material and a dopant material. Examples of the host material of the organic emission layer may include tris(8-hydroxy-quinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4''-tris(carbazol-9-yl) triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), or the like. Examples of the dopant material of the organic emission layer may include 4,4'-bis[4-(di-p-tolylamino)styryl]biphenyl (DPAVBi), 9,10-di(naph-2-tyl)anthracene (ADN), 3-tert-butyl-9,10-di(naph-2-typanthracene (TBADN), or the like.

A size of the intermediate layer 114 is greater than the size of the light reflection member 120. For example, the light reflection member 120 overlaps only a portion of the intermediate layer 114, and not the entire region of the intermediate layer 114. In this manner, a portion of the visible ray that is generated in the intermediate layer 114 and proceeds toward the substrate 101 may reaches the light reflection member 120, and another portion, e.g., a remainder, of the visible ray reaches the first insulating layer 106, the second insulating layer 116, or the buffer layer 102 in a region that is not overlapped by the light reflection member 120.

The second electrode 115 is formed on the intermediate layer 114. The second electrode 115 may be formed of metal including Ag, Mg, Al, Pt, Pd, Au, Ni, Nd, Ir, Cr, Li, or Ca.

Hereinafter, operations and effects of the organic light-emitting display apparatus 100 will be described.

When a voltage is applied to the first electrode 110 and the second electrode 115, a visible ray is emitted from the intermediate layer 114 that is electrically connected with the first electrode 110 and the second electrode 115. A portion of the visible ray proceeds toward the first electrode 110, and another portion, e.g., a remainder, of the visible ray proceeds toward the second electrode 115. The portion of the visible ray that is emitted from the intermediate layer 114 and proceeds toward the first electrode 110 passes through the first electrode 110 and then reaches the light reflection member 120. A portion of the visible ray that reaches the light reflection member 120 is reflected and then proceeds toward the second electrode 115. Then, the portion of the visible ray that proceeds toward the second electrode 115 is reflected again from the second electrode 115, proceeds toward the first electrode 110, and then is reflected from the light reflection member 120. Accordingly, the visible ray that is generated in the intermediate layer 114 performs resonance in a first resonance region SR, e.g., a space between the second electrode 115 and the light reflection member 120. In this manner, a luminescent efficiency of the visible ray generated in the intermediate layer 114 is improved. Thus, an amount of the visible ray which is emitted toward a user is increased, and a light emission efficiency is, thereby, improved.

According to an implementation, a color coordinate characteristic of the visible ray generated in the intermediate layer 114 is improved by an intensive resonance that is generated by using the light reflection member 120. Emission of a vivid visible ray is thereby facilitated.

The second insulating layer 116 is disposed between the first electrode 110 and the light reflection member 120. The positioning of the second insulating layer 116 between the first electrode 110 and the light reflection member 120 may facilitate prevention of optical coherence that may be incurred due to a contact between the first electrode 110 and the light reflection member 120, and may help generate an optical resonance effect between the first electrode 110 and the light reflection member 120.

The organic light-emitting display apparatus 100 may be a bottom emission type organic light-emitting display apparatus in which the visible ray is emitted toward the substrate 101. In this regard, the light reflection member 120 reflects a portion of the visible ray and transmits another portion, e.g., a remainder, of the visible ray, so that the visible ray may be finally emitted toward the substrate 101.

The light reflection member 120 corresponds in position to a portion of the intermediate layer 114, and not to the entire region of the intermediate layer 114. As such, a portion of the visible ray generated in the intermediate layer 114 proceeds toward a region in which the light reflection member 120 does not exist. The visible ray is partially reflected from a surface of an insulating layer, i.e., a surface of the first insulating layer 106, a surface of the second insulating layer 116, or a surface of the buffer layer 102, and then proceeds toward the second electrode 115. The visible ray that proceeds toward the second electrode 115 is reflected, proceeds again toward the first electrode 110, and then is partially reflected from the surface of the insulating layer. Thus, the visible ray generated in the intermediate layer 114 performs resonance in a second resonance region WR, e.g., a space between the second electrode 115 and the second insulating layer 116, a space between the second electrode 115 and the first insulating layer 106, or a space between the second electrode 115 and the buffer layer 102. In this manner, a luminescent efficiency of the visible ray generated in the intermediate layer 114 is improved.

According to an implementation, the resonance in the second resonance region WR is weak resonance having a high transmittance, compared to the intensive resonance generated by the light reflection member 120. Thus, the visible ray generated in the intermediate layer 114 may be minimally changed due to a change in viewing angle of a user. For example, a user may not perceive a change in brightness with respect to front and side surfaces of the organic light-emitting display apparatus 100.

When the organic light-emitting display apparatus 100 is a bottom emission type organic light-emitting display apparatus, the light reflection member 120 is not formed in the second resonance region WR. As such, a transmittance of the visible ray is improved, and brightness deterioration in the organic light-emitting display apparatus 100 is prevented.

According to the present embodiment, an image quality of the organic light-emitting display apparatus 100 is improved by virtue of the optical resonance effect. In particular, by simultaneously performing the intensive resonance using the light reflection member 120 that is formed of metal, and the weak resonance using the first insulating layer 106 and the second insulating layer 116, a vivid color is realized, a color characteristic is improved, and a brightness change due to a change in viewing angle is prevented. Therefore, the image quality of the organic light-emitting display apparatus 100 may be significantly improved.

An area of the first resonance region SR that generates the intensive resonance, and an area of the second resonance region WR that generates the weak resonance may vary according to a desired characteristic of a visible ray. For example, the area of the first resonance region SR may occupy 25 through 70%, more particularly, 50% of an entire area in which the visible ray is realized.

Figure 2:
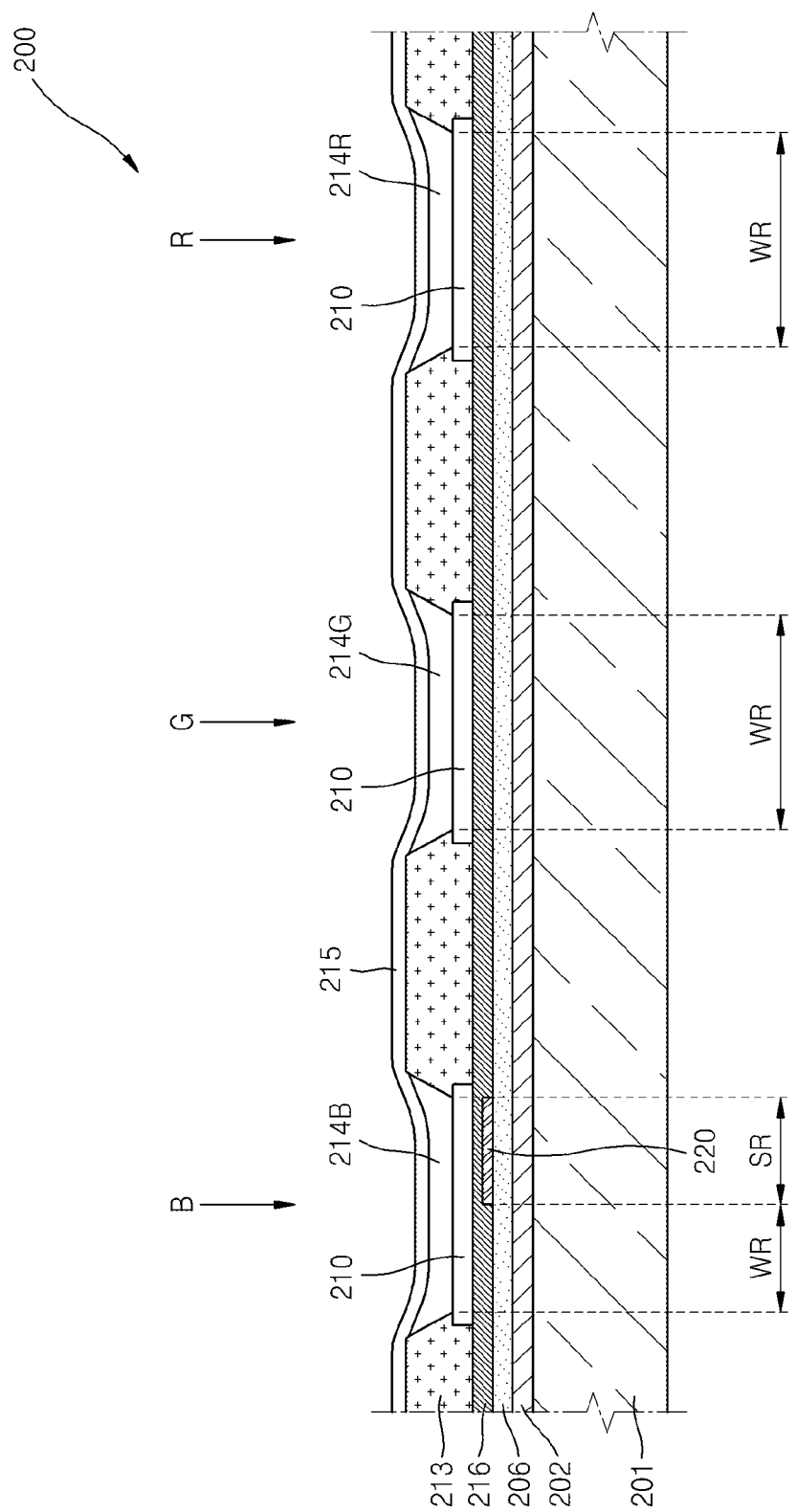
FIG. 2 illustrates a cross-sectional view of an organic light-emitting display apparatus according to another embodiment.

FIG. 2 illustrates a cross-sectional view of an organic light-emitting display apparatus 200 according to another embodiment.

Referring to FIG. 2, the organic light-emitting display apparatus 200 includes a substrate 201, a first electrode 210, a light reflection member 220, an intermediate layer 214, and a second electrode 215. The organic light-emitting display apparatus 200 includes a plurality of sub-pixels, e.g., a blue sub-pixel B, a green sub-pixel G, and a red sub-pixel R. Also, the first electrode 210, the intermediate layer 214, and the second electrode 215 correspond in position with each of the sub-pixels B, G, and R.

Hereinafter, a configuration of each element will be described in detail. For convenience of description, only the features of the present embodiment that are different from the previous embodiment are discussed.

A buffer layer 202 is formed on the substrate 201. The buffer layer 202 may be commonly formed in all of the sub-pixels B, G, and R. A first insulating layer 206 is formed on the buffer layer 202. The first insulating layer 206 is commonly formed in all of the sub-pixels B, G, and R.

The light reflection member 220 having a predetermined size is formed on the first insulating layer 206. In particular, the light reflection member 220 may be formed, for example, only in the blue sub-pixel B or in all of the sub-pixels B, G, and R.

The light reflection member 220 reflects a portion of a visible ray and transmits another portion of the visible ray. The light reflection member 220 may be formed as a thin film including Al or Ag. The light reflection member 220 does not overlap with an entire region of an intermediate layer 214B but overlaps with only a portion of the intermediate layer 214B.

A second insulating layer 216 is formed on the light reflection member 220. The second insulating layer 216 is commonly formed in all of the sub-pixels B, G, and R on the first insulating layer 206 and covers the light reflection member 220.

The first electrode 210 is formed on the second insulating layer 216. The first electrode 210 may correspond to, e.g., be disposed within, each of the sub-pixels B, G, and R. The first electrode 210 may have an island form that is separate in each pixel. For example, a pixel defining layer (PDL) 213 may be between the first electrode 210 of each of the sub-pixels B, G, and R.

The pixel defining layer (PDL) 213 including an insulating material is formed on the first electrode 210. The PDL 213 has an opening so as to expose a top surface of the first electrode 210.

Intermediate layers 214B, 214R, and 214G are formed on the exposed top surface of the first electrode 210. In more detail, the intermediate layer 214B corresponds in position with the blue sub-pixel B, the intermediate layer 214G corresponds in position with the green sub-pixel G, and the intermediate layer 214R corresponds in position with the red sub-pixel R.

The intermediate layers 214B, 214R, and 214G have organic emission layers, respectively, which emit visible rays. The intermediate layer 214B has the organic emission layer that emits a blue visible ray, the intermediate layer 214G has the organic emission layer that emits a green visible ray, and the intermediate layer 214R has the organic emission layer that emits a red visible ray.

The second electrode 215 is formed on the intermediate layers 214B, 214R, and 214G. The second electrode 215 may be commonly formed in all of the sub-pixels B, G, and R.

In the organic light-emitting display apparatus 200, the visible ray generated in the intermediate layer 214B performs resonance in a first resonance region SR, e.g., in a space between the second electrode 215 and the light reflection member 220. In this manner, a luminescent efficiency of the visible ray generated in the intermediate layer 214B is improved. In particular, a color coordinate characteristic of the blue visible ray generated in the intermediate layer 214B is improved by an intensive resonance generated by using the light reflection member 220. Emission of a vivid visible ray is thereby facilitated.

The visible rays generated in the intermediate layers 214B, 214R, and 214G perform resonance in a second resonance region WR, e.g., in a space between the second electrode 215 and the second insulating layer 216, a space between the second electrode 215 and the first insulating layer 206, or a space between the second electrode 215 and the buffer layer 202. In this manner, a luminescent efficiency of the visible rays generated in the intermediate layers 214B, 214R, and 214G are improved. In particular, the visible rays generated in the intermediate layers 214B, 214R, and 214G may be minimally changed due to a change in viewing angle of a user. For example, a user may not perceive a change in brightness with respect to front and side surfaces of the organic light-emitting display apparatus 200.

According to the present embodiment, an image quality of the organic light-emitting display apparatus 200 is improved by using an optical resonance effect. In particular, deterioration of a color characteristic of a blue sub-pixel is a problem in a common organic light-emitting display apparatus. In this regard, the organic light-emitting display apparatus 200 improves a color characteristic of the blue sub-pixel B by performing intensive resonance using the light reflection member 220. Also, weak resonance using an insulating layer is simultaneously performed in the second resonance region WR in the blue sub-pixel B. As such, it is possible to prevent deterioration of brightness and image quality due to a change in viewing angle.

In the sub-pixels R and G, a brightness change due to a change in viewing angle is prevented by performing weak resonance using an insulating layer, i.e., without using a light reflection member. In this manner, it is possible to achieve the organic light-emitting display apparatus 200 having an improved image quality. However, in another embodiment, the light reflection member 220 may be disposed not only in the blue sub-pixel B, but also in the green sub-pixel G or the red sub-pixel R, according to a design condition.

Figure 3:
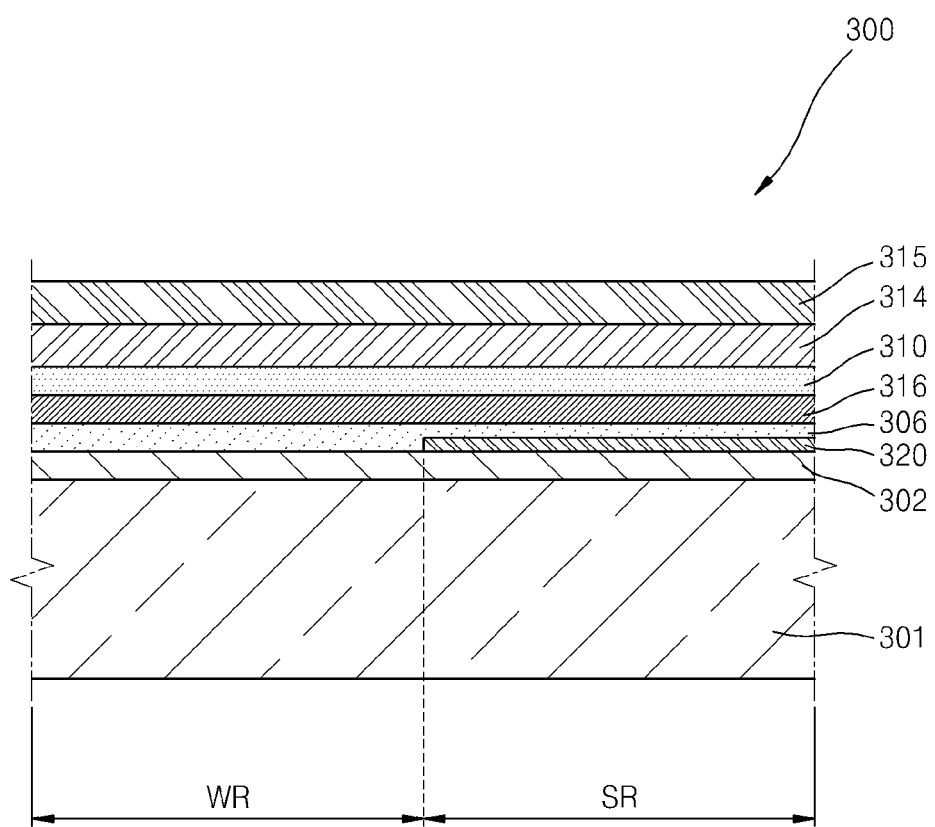
FIG. 3 is a cross-sectional view of an organic light-emitting display apparatus according to another embodiment.

FIG. 3 illustrates a cross-sectional view of an organic light-emitting display apparatus 300 according to another embodiment.

Referring to FIG. 3, the organic light-emitting display apparatus 300 includes a substrate 301, a first electrode 310, a light reflection member 320, an intermediate layer 314, and a second electrode 315. For convenience of description, only features of the present embodiment, which are different from the previous embodiment are discussed.

A buffer layer 302 is formed on the substrate 301. The light reflection member 320 having a predetermined size is formed on the buffer layer 302. The light reflection member 320 overlaps only a portion of the intermediate layer 314, and not an entire region of the intermediate layer 314.

A second insulating layer 306 is formed on the light reflection member 320. The second insulating layer 306 is formed on the buffer layer 302 and covers the light reflection member 320.

A third insulating layer 316 is formed on the second insulating layer 306. The third insulating layer 316 may be formed of various insulating materials. For example, the third insulating layer 316 is formed of an insulating layer including silicon oxide or silicon nitride.

The first electrode 310 is formed on the third insulating layer 316. The intermediate layer 314 is formed on the first electrode 310. The intermediate layer 314 includes an organic emission layer so as to emit a visible ray.

A size of the intermediate layer 314 is greater than the size of the light reflection member 320. That is, the light reflection member 320 overlaps only the portion of the intermediate layer 314, and not the entire region of the intermediate layer 314. In this manner, a portion of the visible ray that is generated in the intermediate layer 314 and proceeds toward the substrate 301 reaches the light reflection member 320, and another portion of the visible ray reaches the second insulating layer 306, the third insulating layer 316, or the buffer layer 302 in a region which is not overlapped by the light reflection member 320. The size of the light reflection member 320 may be less than the size of the first electrode 310. The second electrode 315 is formed on the intermediate layer 314.

According to the present embodiment, the organic light-emitting display apparatus 300 may emit a vivid visible ray by improving a color coordinate characteristic of the visible ray generated in the intermediate layer 314 by an intensive resonance that occurs in a first resonance region SR, e.g., in a space between the second electrode 315 and the light reflection member 320.

The visible ray generated in the intermediate layer 314 performs resonance in a second resonance region WR, e.g., in a space between the second electrode 315 and the third insulating layer 316, a space between the second electrode 315 and the second insulating layer 306, or a space between the second electrode 315 and the buffer layer 302. In this manner, the visible ray generated in the intermediate layer 314 is minimally changed due to a change in viewing angle of a user. For example, a user may not perceive a change in brightness with respect to front and side surfaces of the organic light-emitting display apparatus 300.

In the present embodiment, the second insulating layer 306 and the third insulating layer 316 are disposed between the first electrode 310 and the light reflection member 320. The position of the second insulating layer 306 and the third insulating layer 316 with respect to the first electrode 310 and the light reflection member 320 may facilitate prevention of optical coherence that may be incurred due to a contact between the first electrode 310 and the light reflection member 320, and generation of optical resonance in a space between the first electrode 310 and the light reflection member 320, e.g., in an interface between the second insulating layer 306 and the third insulating layer 316. Thus, the organic light-emitting display apparatus 300 improves an image quality.

Although not illustrated, like the organic light-emitting display apparatus 200 of FIG. 2, the organic light-emitting display apparatus 300 may also include a plurality of sub-pixels. In this regard, the light reflection member 320 may be formed only in a blue sub-pixel.

Figure 4:
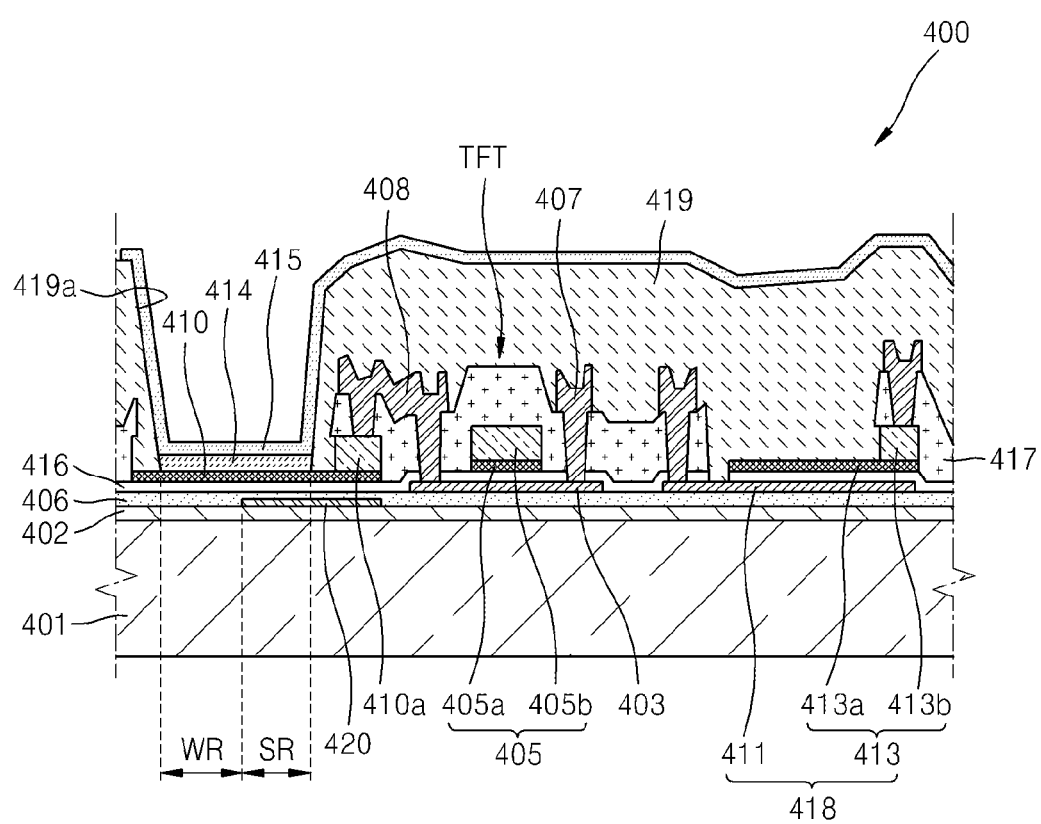
FIG. 4 illustrates a cross-sectional view of an organic light-emitting display apparatus according to another embodiment.

FIG. 4 illustrates a cross-sectional view of an organic light-emitting display apparatus 400, according to another embodiment.

Referring to FIG. 4, the organic light-emitting display apparatus 400 includes a substrate 401, a thin film transistor (TFT), a first electrode 410, a light reflection member 420, an intermediate layer 414, and a second electrode 415. The TFT includes an active layer 403, a gate electrode 405, a source electrode 407, and a drain electrode 408.

Also, the organic light-emitting display apparatus 400 may include at least one capacitor 418. The capacitor 418 includes a first capacitor electrode 411 and a second capacitor electrode 413.

A buffer layer 402 is formed on the substrate 401. The light reflection member 420, having a predetermined size, is formed on the buffer layer 402. In more detail, the light reflection member 420 overlaps only a portion of the intermediate layer 414, and not an entire region of the intermediate layer 414.

A second insulating layer 406 is formed on the light reflection member 420. The second insulating layer 406 is formed on the buffer layer 402 and covers the light reflection member 420.

The active layer 403 is formed on the second insulating layer 406. The first capacitor electrode 411 is formed on the second insulating layer 406. The first capacitor electrode 411 may be formed of the same material as the active layer 403.

A third insulating layer 416 is formed on the second insulating layer 406, and covers the active layer 403 and the first capacitor electrode 411.

The gate electrode 405, the first electrode 410, and the second capacitor electrode 413 are formed on the second insulating layer 406.

The gate electrode 405 includes a first conductive layer 405a and a second conductive layer 405b. The first conductive layer 405a may include a transmission-type conductive material. For example, the gate electrode 405 may include at least one material selected from ITO, IZO, ZnO, $In_2O_3$, IGO and AZO. The second conductive layer 405b may be formed on the first conductive layer 405a, and may include metal or a metal alloy such as Mo, MoW, an Al-based alloy, or the like but is not limited thereto.

The first electrode 410 may include a transmission-type conductive material and may be formed of the same material as the first conductive layer 405a. A conductive unit 410a is disposed on a predetermined region on a top surface of the first electrode 410 and is formed of the same material as the second conductive layer 405b.

The second capacitor electrode 413 includes a first layer 413a and a second layer 413b. In this regard, the first layer 413a is formed of the same material as the first conductive layer 405a, and the second layer 413b is formed of the same material as the second conductive layer 405b. The second layer 413b is formed on the first layer 413a. An area of the second layer 413b is less than an area of the first layer 413a. The second capacitor electrode 413 overlaps the first capacitor electrode 411. A size of the second capacitor electrode 413 is less than a size of first capacitor electrode 411.

An interlayer insulating layer 417 is formed on the first electrode 410, the gate electrode 405, and the second capacitor electrode 413. The interlayer insulating layer 417 may include at least one of various insulating materials including organic and inorganic materials. Although not illustrated, the interlayer insulating layer 417 may have a double-layer structure. For example, the interlayer insulating layer 417 may have a composite structure in which two or more inorganic/organic layers are stacked. In this manner, the interlayer insulating layer 417 may provide increased insulation and protection. An inorganic material that forms the interlayer insulating layer 417 may include silicon oxide or silicon nitride.

The source electrode 407 and the drain electrode 408 are formed on the interlayer insulating layer 417. The source electrode 407 and the drain electrode 408 are connected to the active layer 403.

The source electrode 407 or the drain electrode 408 is electrically connected to the first electrode 410. Referring to FIG. 4, the drain electrode 408 is electrically connected to the first electrode 410. The drain electrode 408 contacts the conductive unit 410a.

A PDL 419 is formed on the interlayer insulating layer 417 and covers the TFT and the capacitor 418. The PDL 419 has a predetermined opening 419a corresponding in position to a top surface of the first electrode 410. The intermediate layer 414 is formed on the top surface of the first electrode 410, which is exposed via the opening 419a of the PDL 419. The second electrode 415 is formed on the intermediate layer 414.

Although not illustrated, an encapsulation member (not shown) may be disposed on the second electrode 415. The encapsulation member may prevent damage to the first electrode 410, the intermediate layer 414, or the second electrode 415 due to external foreign substances or an external shock. The encapsulation member may be formed of glass, a metal thin layer, or the like or may have a composite structure in which an organic material and an inorganic material are stacked.

According to the present embodiment, the organic light-emitting display apparatus 400 may emit a vivid visible ray by improving a color coordinate characteristic of the visible ray generated in the intermediate layer 414 by an intensive resonance that occurs in a first resonance region SR, i.e., in a space between the second electrode 415 and the light reflection member 420.

The visible ray generated in the intermediate layer 414 performs resonance in a second resonance region WR, i.e., in a space between the second electrode 415 and the third insulating layer 416, a space between the second electrode 415 and the second insulating layer 406, or a space between the second electrode 415 and the buffer layer 402. In this manner, the visible ray generated in the intermediate layer 414 is minimally changed due to a change in viewing angle of a user. For example, a user may not perceive a change in brightness with respect to front and side surfaces of the organic light-emitting display apparatus 400.

In the present embodiment, the second insulating layer 406 and the third insulating layer 416 are disposed between the first electrode 410 and the light reflection member 420. The position of the second insulating layer 406 and the third insulating layer 416 with respect to the first electrode 410 and the light reflection member 420 may prevent optical coherence between the first electrode 410 and the light reflection member 420, and generate optical resonance in a space between the first electrode 410 and the light reflection member 420, e.g., in an interface between the second insulating layer 406 and the third insulating layer 416. Thus, the organic light-emitting display apparatus 400 improves an image quality.

Although not illustrated, like the organic light-emitting display apparatus 200 of FIG. 2, the organic light-emitting display apparatus 400 may also include a plurality of sub-pixels. In this regard, the light reflection member 420 may be formed only in a blue sub-pixel.

Also, in the present embodiment, the second insulating layer 406 is formed on the light reflection member 420, and the active layer 403 and the first capacitor electrode 411 are formed on the second insulating layer 406. In this manner, the light reflection member 420 may be formed via a simple process without damaging the active layer 403 and the first capacitor electrode 411.

The gate electrode 405 and the capacitor 418 are formed of the same material on the same layer. As such, a thickness of the organic light-emitting display apparatus 400 may be easily decreased.

The organic light-emitting display apparatus 400 may be a bottom emission type organic light-emitting display apparatus in which the visible ray generated in the intermediate layer 414 is emitted toward the substrate 401. In this regard, by allowing the TFT to be distant from the intermediate layer 414, e.g., spaced from the intermediate layer 414, without overlapping the intermediate layer 414, the visible ray generated in the intermediate layer 414 may easily reach a user via the substrate 401.

However, the organic light-emitting display apparatus 400 is not limited a bottom emission type. Thus, the organic light-emitting display apparatus 400 may be a top emission type organic light-emitting display apparatus in which the visible ray that is generated in the intermediate layer 414 passes through the second electrode 415 and then is recognized as an image to a user.

By way of summation and review, it is not easy to optimally control a characteristic of the visible ray generated in the organic emission layer of an organic light-emitting display apparatus. Also, the visible ray that is generated in the organic emission layer may be extinguished or changed before it reaches a user. Thus, there is a limit in improving an image quality of the organic light-emitting display apparatus.

According to the one or more embodiments, the organic light-emitting display apparatus may easily improve an image quality.

While the embodiments have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus, comprising:
   a substrate;
   a first electrode on the substrate;
   a second electrode on the first electrode;
   an intermediate layer between the first electrode and the second electrode, the intermediate layer being electrically connected with the first electrode and the second electrode, and including an organic emission layer;
   a light reflection member between the substrate and the first electrode, the light reflection member overlapping the first and second electrodes and a portion of the intermediate layer in a direction perpendicular to the substrate; and
   a first insulating layer coupled to the first electrode, wherein:
   the portion of the intermediate layer is less than an entire region of the intermediate layer, and
   the first insulating layer has a first thickness between the light reflection member and the first electrode and a second thickness at an area which does not overlap the light reflection member in a direction perpendicular to the substrate;
   wherein the light reflection member is smaller than an overlapping region of the first electrode, the overlapping region of the first electrode overlapping the intermediate layer in a direction perpendicular to the substrate,
   wherein the overlapping region of the first electrode includes a first region and second region,
   wherein the first region of the overlapping region is overlapping the light reflection member in a direction perpendicular to the substrate, the second region of the overlapping region is not overlapping the light reflection member in a direction perpendicular to the substrate, and the first region contacts the second region, and
   wherein the light reflection member extends beyond the intermediate layer in a direction parallel to the substrate.

2. The organic light-emitting display apparatus of claim 1, wherein the light reflection member reflects a portion of a visible ray and transmits another portion of the visible ray.

3. The organic light-emitting display apparatus of claim 1, wherein a size of the light reflection member is less than a size of the intermediate layer.

4. The organic light-emitting display apparatus of claim 1, wherein a size of the light reflection member is less than a size of the first electrode.

5. The organic light-emitting display apparatus of claim 1, further comprising a second insulating layer between the substrate and the light reflection member.

6. The organic light-emitting display apparatus of claim 5, further comprising a buffer layer between the substrate and the first insulating layer.

7. The organic light-emitting display apparatus of claim 5, further comprising a third insulating layer between the first insulating layer and the first electrode.

8. The organic light-emitting display apparatus of claim 1, wherein the light reflection member includes silver (Ag) or aluminum (Al) or the first electrode includes indium tin oxide (ITO), indium zinc oxide (IZO), zinc oxide (ZnO), indium oxide (In2O3), indium gallium oxide (IGO), or aluminum zinc oxide (AZO).

9. The organic light-emitting display apparatus of claim 1, wherein the organic light-emitting display apparatus includes a plurality of sub-pixels,
   the first electrode, the intermediate layer, and the second electrode correspond in position with each of the plurality of sub-pixels, and
   the light reflection member corresponds in position with at least one sub-pixel from among the plurality of sub-pixels.

10. The organic light-emitting display apparatus of claim 9, wherein
   at least some of the plurality of sub-pixels are for emitting visible rays having different colors, and
   the light reflection member corresponds in position with at least one sub-pixel from among the plurality of sub-pixels, wherein the at least one sub-pixel emits a visible ray having one of the different colors.

11. The organic light-emitting display apparatus of claim 10, wherein the light reflection member corresponds in position with a sub-pixel from among the plurality of sub-pixels that emits a blue visible ray.

12. The organic light-emitting display apparatus of claim 1, further including a thin film transistor (TFT) on the substrate, the thin film transistor (TFT) being electrically connected to the first electrode, and comprising an active layer, a gate electrode, a source electrode, and a drain electrode.

13. The organic light-emitting display apparatus of claim 12, wherein the light reflection member and the active layer are on different layers, and the light reflection member is closer to the substrate than the active layer.

14. The organic light-emitting display apparatus of claim 12, wherein the first electrode is on a same layer as the gate electrode and includes at least a portion of a material that forms the gate electrode.

15. The organic light-emitting display apparatus of claim 12, wherein the gate electrode includes a first conductive layer and a second conductive layer on the first conductive layer, the first electrode including a same material as the first conductive layer and being on a same layer as the first conductive layer.

16. The organic light-emitting display apparatus of claim 12, wherein the intermediate layer does not overlap the TFT and is spaced from the TFT.

17. The organic light-emitting display apparatus of claim 12, further comprising a capacitor having a first capacitor electrode and a second capacitor electrode, wherein the first capacitor electrode is on a same layer as the active layer, and the second capacitor electrode is on a same layer as the gate electrode.

18. The organic light-emitting display apparatus of claim 12, wherein the light reflection member overlaps the drain electrode in a direction perpendicular to the substrate.

19. The organic light-emitting display apparatus of claim 1, wherein the light reflection member is not an electrode.

20. The organic light-emitting display apparatus of claim 1, wherein:
   a first space between the light reflection member and the second electrode corresponds to a first resonance region for light emitted by the organic emission layer, the first resonance region including the first insulating layer of the first thickness, and
   a second space between the second electrode and another layer corresponds to a second resonance region for light emitted by the organic emission layer, wherein the first space has a size different from the second space, wherein the light reflection member does not overlap the second resonance region, and wherein the second resonance region includes the first insulating layer of the second thickness.

21. The organic light-emitting display apparatus of claim 20, wherein:
   the first resonance region has a first height, and
   the second resonance region has a second height different from the first height.

22. The organic light-emitting display apparatus of claim 21, wherein the second height is greater than the first height.

23. The organic light-emitting display apparatus of claim 20, wherein:
   the first resonance region has a first light transmittance, and
   the second resonance region has a second light transmittance different from the first light transmittance.

24. The organic light-emitting display apparatus of claim 23, wherein the second light transmittance is greater than the first light transmittance.

25. The organic light-emitting display apparatus of claim 24, wherein:
   the first resonance region and the second resonance region correspond to a same pixel, and
   a difference between a brightness of the pixel from a first angle and a brightness of the pixel from a second angle different from the first angle is reduced based on light emitted from the first resonance region.

26. The organic light-emitting display apparatus of claim 25, wherein:
   the first angle is substantially perpendicular to the substrate, and
   the second angle is corresponds to a side viewing angle relative to the pixel.

* * * * *